United States Patent
Sinha et al.

(10) Patent No.: US 10,241,973 B2
(45) Date of Patent: Mar. 26, 2019

(54) SYSTEM AND METHOD FOR REDUCING SIZE OF RAW DATA BY PERFORMING TIME-FREQUENCY DATA ANALYSIS

(71) Applicant: Tata Consultancy Services Limited, Mumbai (IN)

(72) Inventors: Rahul Sinha, Bangalore (IN); Balamuralidhar Purushothaman, Bangalore (IN); Tapas Chakravarty, Kolkata (IN)

(73) Assignee: Tata Consultancy Services Limited, Mumbai (IN)

( * ) Notice: Subject to any disclaimer, the term of this patent is extended or adjusted under 35 U.S.C. 154(b) by 526 days.

(21) Appl. No.: 15/061,929

(22) Filed: Mar. 4, 2016

(65) Prior Publication Data
US 2016/0259849 A1    Sep. 8, 2016

(30) Foreign Application Priority Data
Mar. 5, 2015    (IN) .......................... 729/MUM/2015

(51) Int. Cl.
G06F 17/30    (2006.01)
G06F 17/18    (2006.01)
(Continued)

(52) U.S. Cl.
CPC .............. *G06F 17/18* (2013.01); *G06F 17/14* (2013.01); *H03M 7/3068* (2013.01)

(58) Field of Classification Search
None
See application file for complete search history.

(56) References Cited

U.S. PATENT DOCUMENTS

| 4,894,795 A | 1/1990 | Whitehouse et al. |
| 5,845,241 A | 12/1998 | Owechko |

(Continued)

FOREIGN PATENT DOCUMENTS

CN    102866027    1/2013

OTHER PUBLICATIONS

Rioul, O. et al., "Time Scale Energy Distributions: A General Class Extending Wavelet Transform", IEEE Transactions on Signal Processing, vol. 40, No. 7, pp. 1746-1757, (1992).

(Continued)

*Primary Examiner* — Wilson Lee
(74) *Attorney, Agent, or Firm* — Finnegan, Henderson, Farabow, Garrett & Dunner LLP

(57) ABSTRACT

Disclosed is a method and system for reducing data size of raw data. The system may process the raw data for calculating Renyi entropies, Wigner Ville Distributions (WVD's), Wigner Ville Spectrum (WVS) and Renyi divergence. The system may identify a first set of windows followed by a second set of windows while processing the raw data. Further, the system may calculate Eigen values for a Time-Frequency matrix of WVS of the second set of windows. The system may filter the second set of windows based on the Eigen values for preparing a third set of windows. The system prepares clusters of the Eigen values. The system may compute centroids of the clusters of the Eigen values. The system classifies each window of the third set of windows into one of the clusters indicating a relevant category of event identified from the raw data.

17 Claims, 13 Drawing Sheets

(51) Int. Cl.
*G06F 17/14* (2006.01)
*H03M 7/30* (2006.01)

(56) References Cited

U.S. PATENT DOCUMENTS

| | | | | |
|---|---|---|---|---|
| 6,675,106 | B1* | 1/2004 | Keenan | G01J 3/28 |
| | | | | 702/194 |
| 9,886,945 | B1* | 2/2018 | Sieracki | G10L 15/063 |
| 2010/0332475 | A1* | 12/2010 | Birdwell | G06F 17/30333 |
| | | | | 707/737 |
| 2015/0088024 | A1* | 3/2015 | Sackellares | A61B 5/0476 |
| | | | | 600/544 |
| 2015/0142807 | A1* | 5/2015 | Hofmann | G06F 17/30424 |
| | | | | 707/737 |
| 2016/0242690 | A1* | 8/2016 | Principe | A61B 5/742 |

OTHER PUBLICATIONS

Flandrin, P., et al., "Time-Frequency Energy Distributions Meet Compressed Sensing", IEEE Transactions on Signal Processing, vol. 58, No. 6, pp. 2974-2982, (2010).

* cited by examiner o – Scatter plot of Eigen values

* – Centroids of the Eigen value scatter

SYSTEM AND METHOD FOR REDUCING SIZE OF RAW DATA BY PERFORMING TIME-FREQUENCY DATA ANALYSIS

PRIORITY CLAIM

This U.S. patent application claims priority under 35 U.S.C. § 119 to: India Application No. 729/MUM/2015, filed on 5 Mar. 2015. The entire contents of the aforementioned application are incorporated herein by reference.

TECHNICAL FIELD

The present subject matter described herein, in general, relates to achieving reduction in data size.

BACKGROUND

Data communication over a network plays an important role in functioning of several systems working in various technology domains. The data communication may take place through a wired or a wireless medium. A wireless medium, when used for data transmission, places restriction on a speed and a volume of data transfer. For example, Wireless Sensor Networks (WSN) systems have a large number of nodes for monitoring environmental parameters. The nodes continuously transfer data i.e. sensed environmental parameters, amongst each other and to a central server. The nodes transfer the data over a wireless network. Continuous transmission of the data over the wireless network consumes a lot of bandwidth and energy and thus results into high communication costs. Thus, the amount of the data needs to be reduced in order to improve the speed of transmission and to limit an amount of bandwidth consumed while transmitting the data wirelessly over a network.

Conventionally, the data is compressed before it is wirelessly transmitted over a network. The compressed data is then reconstructed by the receiver taking care of the reconstruction distortion. However, dynamic systems like the sensors record non-stationary data. Statistical and spectral properties of the non-stationary data vary with time and thus create an impact on compression of the data. Further, continuous data transmission results in transmitting trivial information present in the data.

SUMMARY

This summary is provided to introduce aspects related to systems and methods for reducing size of raw data and the aspects are further described below in the detailed description. This summary is not intended to identify essential features of the claimed subject matter nor is it intended for use in determining or limiting the scope of the claimed subject matter.

In one implementation, a method for reducing size of raw data is disclosed. The method may comprise calculating Wigner Ville Distributions (WVD's) for a plurality of windows of raw data. A window of the plurality of windows may comprise a predefined number of samples of the raw data. The method may comprise computing Renyi entropies over the WVD's for the plurality of windows. The method may further comprise computing a distribution of magnitudes of the Renyi entropies over the plurality of windows. The method may further comprise identifying a first set of windows from the plurality of windows based upon a Renyi entropy threshold and upon the distribution of magnitude of the Renyi entropies. The method may also comprise computing a Wigner Ville Spectrum (WVS) of the first set of windows. The WVS may indicate an average of the WVD's of all windows present in the first set of windows. The WVS may be stored in form of a Time-Frequency matrix. The method may further comprise computing a Renyi divergence using the WVS and the WVD's for the first set of windows. The method may comprise computing a distribution of the Renyi divergence over the first set of windows. The method may further comprise preparing a dataset comprising a second set of windows selected from the first set of windows. The second set of windows may have the Renyi divergence lower than a predefined divergence threshold. The method may comprise calculating Eigen values for the Time-Frequency matrix of the WVS of the second set of windows. The Eigen values may indicate spectral features of the second set of windows. The method may also comprise identifying a third set of windows from the second set of windows. The third set of windows may have the Eigen values greater than a predefined Eigen threshold. The method may comprise clustering the Eigen values of the third set of windows into clusters of Eigen values based upon a nearest neighbour rule. The method may further comprise computing centroids of the clusters of Eigen values. The centroids may indicate relevant categories of events. The method may further comprise classifying at least one window, of the third set of windows, with the Eigen values having a nearest distance to one of the centroids. Thus, the size of the raw data may be reduced, in an above described manner.

In one implementation, a system for reducing size of raw data is disclosed. The system comprises a processor and a memory coupled to the processor for executing programmed instructions stored in the memory. The processor may calculate Wigner Ville Distributions (WVD's) for a plurality of windows of raw data. A window of the plurality of windows may comprise a predefined number of samples of the raw data. The processor may further compute Renyi entropies over the WVD's for the plurality of windows. The processor may further compute a distribution of magnitudes of the Renyi entropies over the plurality of windows. The processor may further identify a first set of windows from the plurality of windows based upon a Renyi entropy threshold and upon the distribution of magnitudes of the Renyi entropies. The processor may also compute Wigner Ville Spectrum (WVS) of the first set of windows. The WVS may indicate an average of the WVD's of all windows present in the first set of windows. The WVS may be stored in form of a Time-Frequency matrix. The processor may compute a Renyi divergence using the WVS and the WVD's for the first set of windows. The processor may compute a distribution of the Renyi divergence over the first set of windows. The processor may further prepare a dataset comprising a second set of windows selected from the first set of windows. The second set of windows may have the Renyi divergence lower than a predefined divergence threshold. The processor may also calculate Eigen values for the Time-Frequency matrix of the WVS of the second set of windows. The Eigen values may indicate spectral features of the second set of windows. The processor may identify a third set of windows from the second set of windows. The third set of windows may have the Eigen values greater than a predefined Eigen threshold. The processor may cluster the Eigen values of the third set of windows into clusters of Eigen values based upon a nearest neighbour rule. The processor may also compute centroids of the clusters of Eigen values. The centroids may indicate relevant categories of events. The processor may further classify at least one window, of the third set of windows, with the Eigen values having a nearest distance to one of the centroids. Thus, the size of the raw data may be reduced, in an above described manner.

In one implementation, a non-transitory computer readable medium embodying a program executable in a computing device for reducing size of raw data is disclosed. The program may comprise a program code for calculating Wigner Ville Distributions (WVD's) for a plurality of windows of raw data. A window of the plurality of windows may comprise a predefined number of samples of the raw data. The program may further comprise a program code for computing Renyi entropies over the WVD's for the plurality of windows. The program may further comprise a program code for computing a distribution of magnitudes of the Renyi entropies over the plurality of windows. The program may further comprise a program code for identifying a first set of windows from the plurality of windows based upon a Renyi entropy threshold and upon the distribution of magnitudes of the Renyi entropies. The program may further comprise a program code for computing a Wigner Ville Spectrum (WVS) of the first set of windows. The WVS may indicate an average of the WVD's of all windows present in the first set of windows. The WVS may be stored in form of a Time-Frequency matrix. The program may further comprise a program code for computing a Renyi divergence using the WVS and the WVD's for the first set of windows. The program may further comprise a program code for computing a distribution of the Renyi divergence over the first set of windows. The program may further comprise a program code for preparing a dataset comprising a second set of windows selected from the first set of windows. The second set of windows may have the Renyi divergence lower than a predefined divergence threshold. The program may further comprise a program code for calculating Eigen values for the Time-Frequency matrix of the WVS of the second set of windows. The Eigen values may indicate spectral features of the second set of windows. The program may further comprise a program code for identifying a third set of windows from the second set of windows. The third set of windows may have the Eigen values greater than a predefined Eigen threshold. The program may further comprise a program code for clustering the Eigen values of the third set of windows into clusters of Eigen values based upon a nearest neighbour rule. The program may further comprise a program code for computing centroids of the clusters of Eigen values. The centroids may indicate relevant categories of events. The program may further comprise a program code for classifying at least one window, of the third set of windows, with the Eigen values having a nearest distance to one of the centroids. Thus, the size of the raw data may be reduced, in an above described manner.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

System and method for reducing size of raw data are described in the present subject matter. The system may calculate Wigner Ville Distributions (WVD's) for a plurality of windows of raw data. A window of the plurality of windows may comprise a predefined number of samples of the raw data. Post calculating the WVD's, the system may compute Renyi entropies over the WVD's for the plurality of windows. Further, the system may compute a distribution of magnitudes of the Renyi entropies over the plurality of windows. Further, the system may define a Renyi entropy threshold. Subsequently, the system may identify a first set of windows from the plurality of windows based upon the Renyi entropy threshold and upon the distribution of magnitude of the Renyi entropies.

Post identifying the first set of windows, the system may compute a Wigner Ville Spectrum (WVS) of the first set of windows. The WVS may indicate an average of the WVD's of all windows present in the first set of windows. In one embodiment, the system may store the WVS in form of a Time-Frequency matrix. Further, the system may compute a Renyi divergence using the WVS and the WVD's for the first set of windows. Subsequently, the system may compute a distribution of the Renyi divergence over the first set of windows. Post computing the distribution of the Renyi divergence, the system may prepare a dataset comprising a second set of windows. The system may select the second set of windows from the first set of windows having the Renyi divergence lower than a predefined divergence threshold.

Upon preparing the second set of windows, the system may calculate Eigen values for the Time-Frequency matrix of the WVS of the second set of windows. The Eigen values may indicate spectral features of the second set of windows. Further, the system may identify a third set of windows from the second set of windows. The system may identify the third set of windows having the Eigen values greater than a predefined Eigen threshold. Subsequently, the system may cluster the Eigen values of the third set of windows into clusters of the Eigen values. In one embodiment, the system may use a nearest neighbor rule for clustering the Eigen values. Post clustering, the system may compute centroids of the clusters. The centroids may indicate relevant categories of events. The system may classify at least one window, of the third set of windows, with the Eigen values having a nearest distance to one of the centroids. Thus, the system may achieve reduction in data size of the raw data using an above described method.

While aspects of described system and method for reducing size of raw data may be implemented in any number of different computing systems, environments, and/or configurations, the embodiments are described in the context of the following exemplary system.

Figure 1:
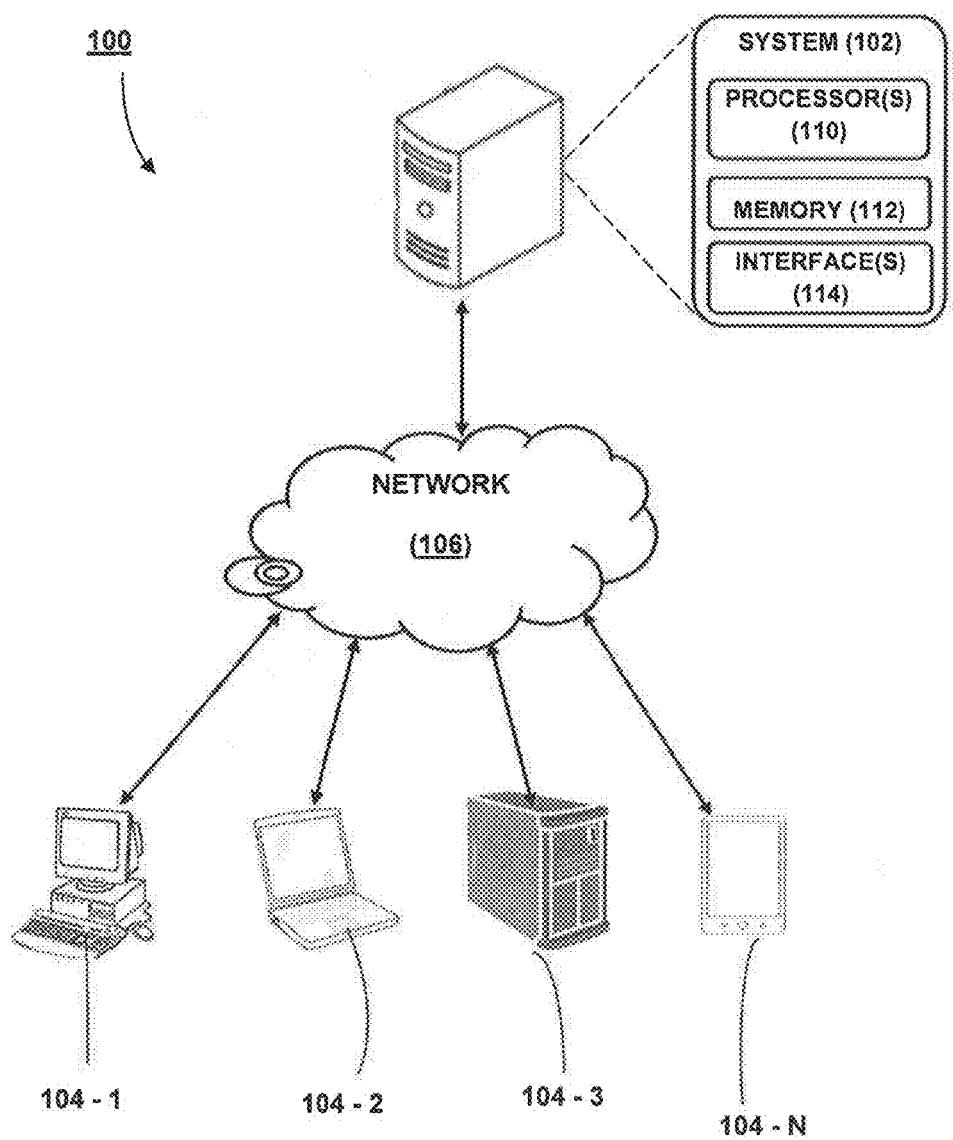
FIG. 1 illustrates a network implementation of a system for reducing size of raw data, in accordance with an embodiment of the present subject matter.

Referring now to FIG. 1, the system 102 for reducing size of raw data is shown, in accordance with an embodiment of the present subject matter. Although the present subject matter is explained considering that the system 102 is implemented on a computer, it may be understood that the system 102 may also be implemented in a variety of computing systems including but not limited to, a smart phone, a tablet, a notepad, a personal digital assistant, a handheld device, a laptop computer, a notebook, a workstation, a mainframe computer, a server, and a network server.

Figure 2:
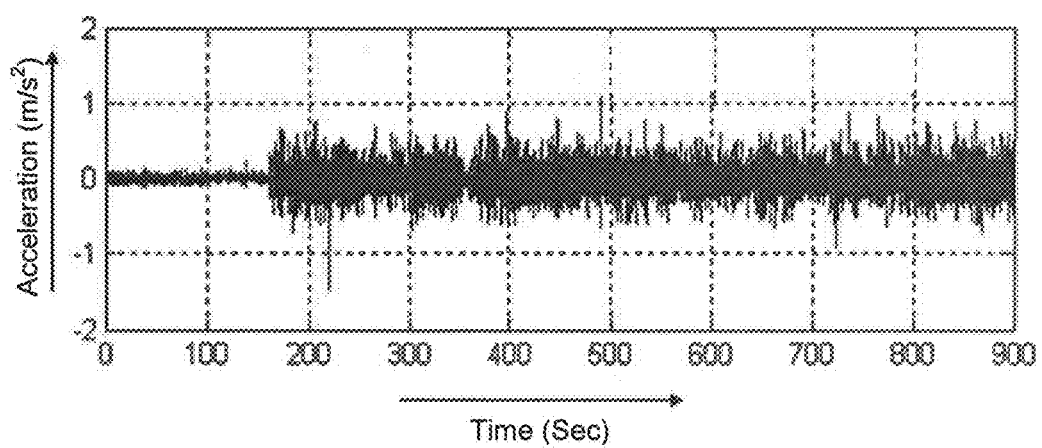
FIG. 2 illustrates a graphical representation of raw data captured by a sensor, in accordance with an embodiment of the present subject matter.

In one embodiment, as illustrated using FIG. 2, the system 102 may include at least one processor 110, a memory 112, and input/output (I/O) interfaces 114. Further, the at least one processor 110 may be implemented as one or more microprocessors, microcomputers, microcontrollers, digital signal processors, central processing units, state machines, logic circuitries, and/or any devices that manipulate signals based on operational instructions. Among other capabilities, the at least one processor 110 is configured to fetch and execute computer-readable instructions stored in the memory 112.

The I/O interfaces 114 may include a variety of software and hardware interfaces, for example, a web interface, a graphical user interface, and the like. The I/O interfaces 114 may allow the system 102 to interact with a user directly. Further, the I/O interfaces 114 may enable the system 102 to communicate with other computing devices, such as web servers and external data servers (not shown). The I/O interfaces 114 can facilitate multiple communications within a wide variety of networks and protocol types, including wired networks, for example, LAN, cable, etc., and wireless networks, such as WLAN, cellular, or satellite.

The memory 112 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes.

In one implementation, the system 102 may receive raw data recorded by sensors. The raw data may comprise at least one of an acceleration data of a vehicle and an Electrocardiogram (ECG) data and other data present in an analog form. Digital data may be converted into an analog form using Digital to Analog Converters (DAC's) at first, and may then be used by the system 102. In one embodiment, the raw data may be the acceleration data of the vehicle. However, the description may now be provided with reference to the acceleration data, other raw data can be used in a similar manner. FIG. 2 illustrates a graphical representation of the raw data, wherein x-axis represents time in seconds and y-axis represents acceleration in m/s2.

In one embodiment, the system 102 may calculate Wigner Ville Distributions (WVD's) for a plurality of windows of the raw data. The plurality of windows may comprise a predefined number of samples of the raw data. For example, each window of the plurality of windows may comprise 16 samples of the raw data. Further, the system 102 may calculate the WVD's for the plurality of windows of the raw data using a below mentioned equation 1.

$$W_x(t, f) = \int_\tau x(t+\tau/2)x^*(t-\tau/2)e^{-j2\pi f\tau}d\tau \quad \text{Equation 1}$$

Here, in the equation 1, x(t) denotes a random analog signal.

Post calculating the WVD's, the system 102 may compute Renyi entropies over the WVD's for the plurality of windows. The Renyi entropies are an indicative of a complexity of the raw data. Further, the complexity of the raw data may indicate an amount of information present in the raw data. In one embodiment, the system 102 may compute Renyi entropy for a window, of the plurality of windows, using a below mentioned equation 2.

$$H_\alpha(X) = \frac{1}{1-\alpha}\log_2 \int_t \int_f \left(\frac{W_x(t,f)}{\int\int_{u\,v} W_x(u,v)dudv}\right)^\alpha dtdf \quad \text{Equation 2}$$

In the above mentioned equation 2, $H\alpha(X)$ denotes Renyi entropy and '$\alpha$' denotes an order of the Renyi entropy. In one embodiment, the Renyi entropy of third order may be computed by using a value of $\alpha=3$ in the equation 2.

Figure 3:
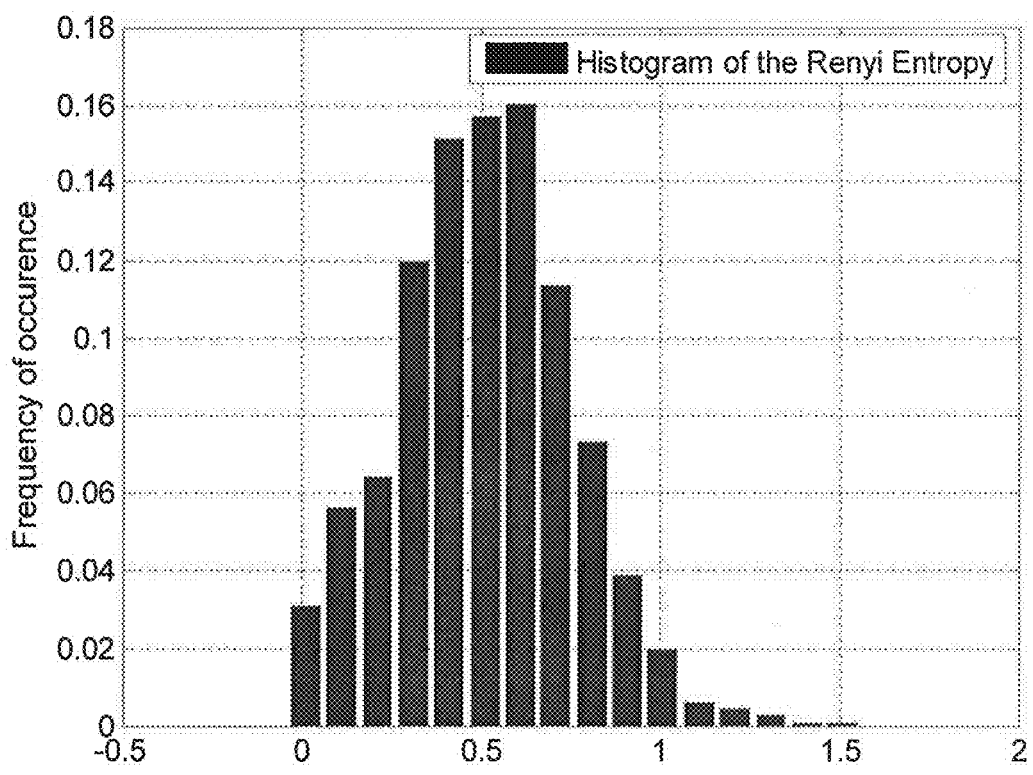
FIG. 3 illustrates a histogram of a distribution of magnitudes of Renyi entropies, in accordance with an embodiment of the present subject matter.

Subsequent to calculation of the Renyi entropies, the system 102 may compute a distribution of magnitudes of the Renyi entropies over the plurality of windows. FIG. 3 illustrates a histogram of the distribution of magnitudes of the Renyi entropies.

Upon computing the distribution of magnitudes of the Renyi entropies, the system 102 may identify a first set of windows from the plurality of windows. The system 102 may identify the first set of windows based upon the distribution of the magnitudes of the Renyi entropies, as calculated in the previous step. Further, the system 102 may make use of a Renyi entropy threshold on the magnitudes of the Renyi entropies for identifying the first set of windows. In one embodiment, the system 102 may choose a value of the Renyi entropy threshold as 0.3. Thus, the system 102 may identify the first set of windows having a value of the Renyi entropies equal to or less than chosen Renyi entropy threshold. Thus, the system 102 may bring out a low entropy data by identify the first set of windows. The low entropy data may correspond to a lower complexity of the data indicating presence of deterministic events in the data. The deterministic events are indicative of sharp transitions in the data.

Figure 4:
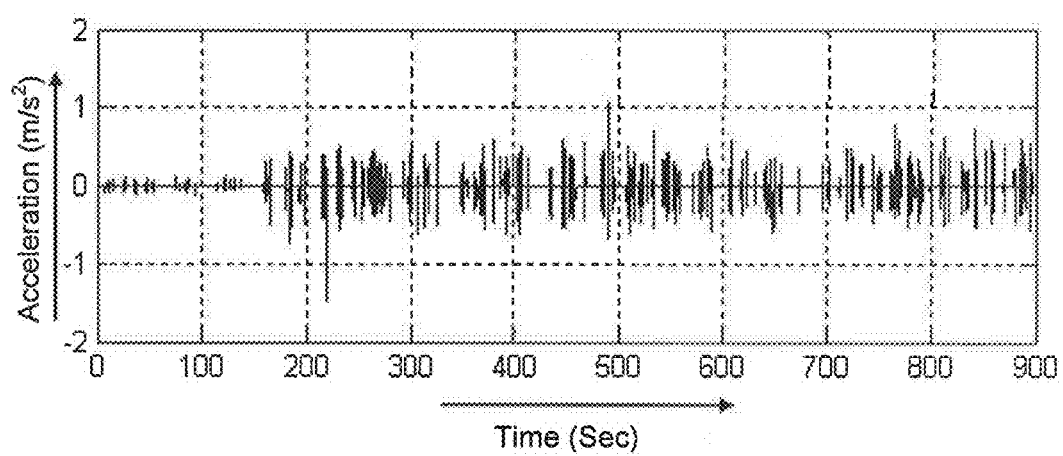
FIG. 4 illustrates a graphical representation of data representing a first set of windows, wherein the first set of windows comprise Renyi entropies lower than a Renyi entropy threshold, in accordance with an embodiment of the present subject matter.

FIG. 4 illustrates a graphical representation of data i.e the first set of windows. The first set of windows comprises Renyi entropies lower than the Renyi entropy threshold. In the FIG. 4, x-axis represents time in seconds and y-axis represents acceleration in m/s2.

Post identifying the first set of windows, the system 102 may compute a Wigner Ville Spectrum (WVS) of the first set of windows. The WVS may indicate an average of the WVD's of all windows present in the first set of windows. In one embodiment, the system 102 may store the WVS in form of a Time-Frequency matrix. The system 102 may compute the WVS using a below mentioned equation 3.

$$\overline{W}_x(t,f) = E[W_x(t,f)] \quad \text{Equation 3}$$

Substituting the value of the Wx (t,f) (i.e. WVD's) from the Equation 1 into the Equation 3, the WVS may be derived as represented by a below mentioned Equation 4.

$$\overline{W}_x(t, f) = E\left[\int_\tau x(t+\tau/2)x^*(t-\tau/2)e^{-j2\pi f\tau}d\tau\right] =$$

$$\int_\tau R_x(t+\tau/2, t-\tau/2)e^{-j2\pi f\tau}d\tau$$

Equation 4

Upon computing the WVS, the system 102 may compute a Renyi divergence using the WVS and the WVD's for the first set of windows. In one embodiment, the system 102 may compute the Renyi divergence by histogram evaluation. The system 102 may compute the Renyi divergence using below mentioned equations 5, 6, and 7.

$$R_\alpha(X_1, X_2) = \frac{1}{1-\alpha}\log\int\int X_1(t, f)\left[\frac{X_1(t, f)}{X_2(t, f)}\right]^{\alpha-1}dtdf \quad \text{Equation 5}$$

$$X_1(t, f) = \frac{W_{xE}(t, f)}{\int\int_{u\,v} W_{xE}(u, v)dudv} \quad \text{Equation 6}$$

$$X_2(t, f) = \frac{\overline{W}_{xE}(t, f)}{\int\int_{u\,v} \overline{W}_{xE}(u, v)dudv} \quad \text{Equation 7}$$

The low entropy data (i.e. the first set of windows) is denoted using $x_E(t)$ Thus, in the Equations 5, 6, and 7, the WVD's are denoted using $W_{xE}(t, f)$ and the WVS is denoted using $\overline{W}_{xE}(t, f)$.

Figure 5:
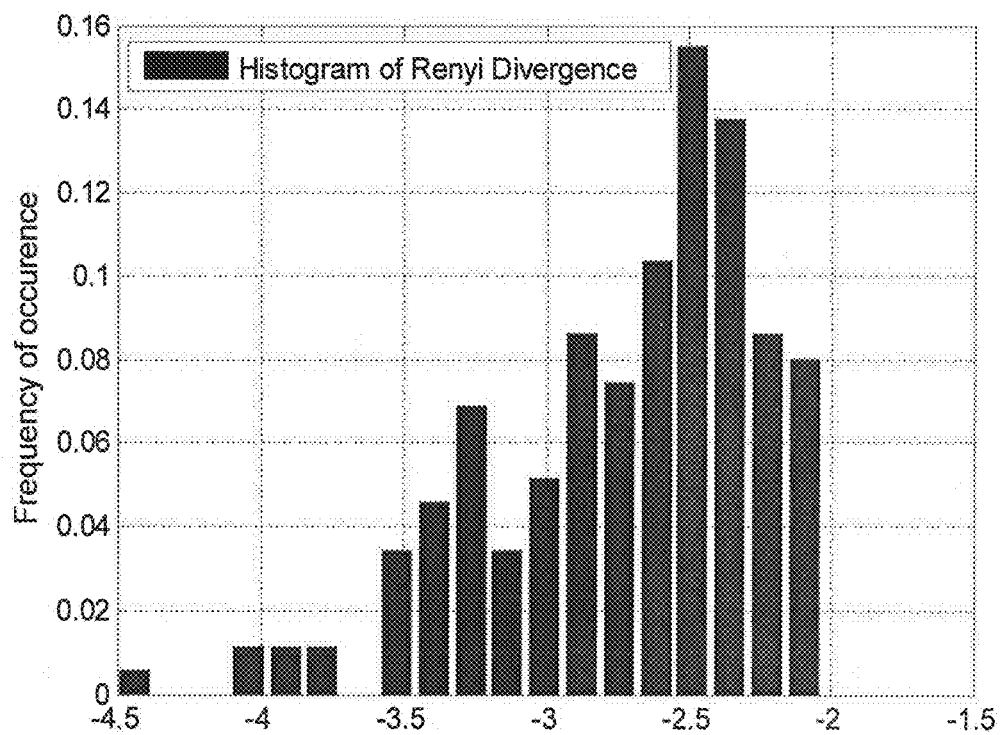
FIG. 5 illustrates a histogram of a distribution of the Renyi divergence, in accordance with an embodiment of the present subject matter.

After computing the Renyi divergence, the system 102 may compute a distribution of the Renyi divergence over the first set of windows. Referring to FIG. 5, a histogram of the distribution of the Renyi divergence is illustrated.

Post computing the distribution of the Renyi divergence, the system 102 may prepare a dataset comprising a second set of windows selected from the first set of windows. The system 102 may select windows, from the first set of windows, having the Renyi divergence lower than a pre-defined divergence threshold and prepare the second set of windows. The system 102 may use a small value of the divergence threshold for identifying windows (i.e. data segments) having a statistical similarity.

Figure 6A:
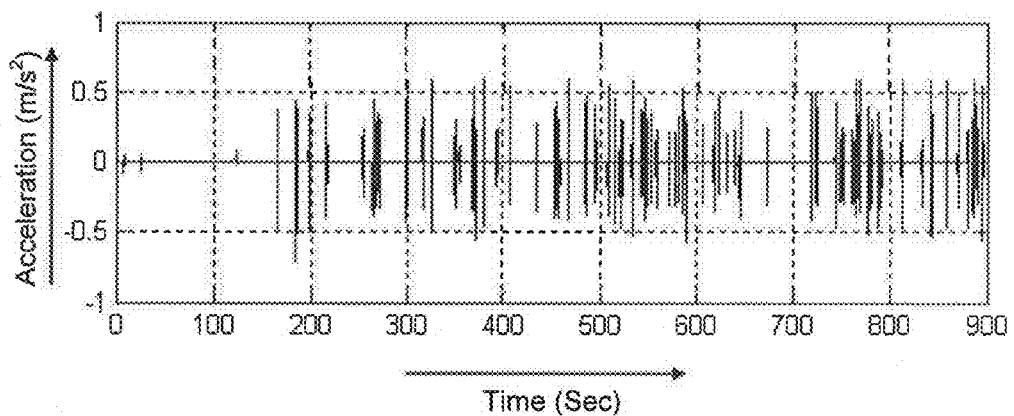
FIG. 6a illustrates a graphical representation of the first set of windows having the Renyi divergence greater than a divergence threshold, in accordance with an embodiment of the present subject matter.
Figure 6B:
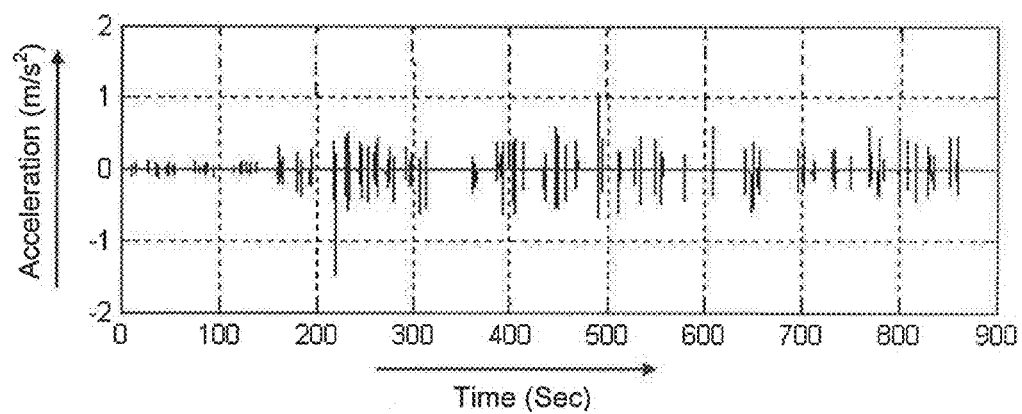
FIG. 6b illustrates a graphical representation of the first set of windows having the Renyi divergence lower than the divergence threshold, in accordance with an embodiment of the present subject matter.

Referring to FIG. 6a, a graphical representation of the first set of windows having the Renyi divergence greater than the divergence threshold is illustrated. In one embodiment, the data present in the first set of windows, the Renyi divergence greater than the divergence threshold, may be identified as noise s0 (t). Further, referring to FIG. 6b, a graphical representation of the first set of windows having the Renyi divergence lower than the divergence threshold is illustrated. In the FIG. 6a and FIG. 6b, X-axis indicate time in seconds and Y-axis indicates acceleration in m/s2. In one embodiment, the data present in the first set of windows, having the Renyi divergence lower than the divergence threshold, may be identified as a signal of interest s1 (t). For example, a value of −2.5 may be used as the divergence threshold for distinguishing between the noise and the signal of interest. Thus, the system 102 may learn to distinguish between the noise and the signal of interest, based on the divergence threshold. In one embodiment, the divergence threshold may be selected based on time-frequency test statistics.

The time-frequency test statistics for distinguishing between the noise and the signal of interest may be determined based on a formula provided by a below mentioned Equation 8.

$$\Lambda(x) = \int_t\int_f \rho(t, f)W_{xE}(t, f)dtdf \quad \text{Equation 8}$$

Here, in the Equation 8, $W_{xE}(t,f)$ denotes a WVD of each window of the first set of windows and $\rho(t, f)$ denotes a time-frequency weighting function. The time-frequency weighting function may be approximated using below mentioned Equations 9 and 10.

$$\tilde{\rho}_1(t, f) \approx \frac{\overline{W}_{s1}(t, f)}{\overline{W}_{s0}(t, f), [\overline{W}_{x1}(t, f) + \overline{W}_{s0}(t, f)]} \quad \text{Equation 9}$$

$$\tilde{\rho}_0(t, f) \approx \frac{\overline{W}_{s1}(t, f)}{[\overline{W}_{x0}(t, f)]^2} \quad \text{Equation 10}$$

Here, in the Equations 9 and 10 $\overline{W}_{s1}(t, f)$ denotes the WVS of s1 (t) and $\overline{W}_{s0}(t, f)$ denotes the WVS of s0 (t).

Figure 7A:
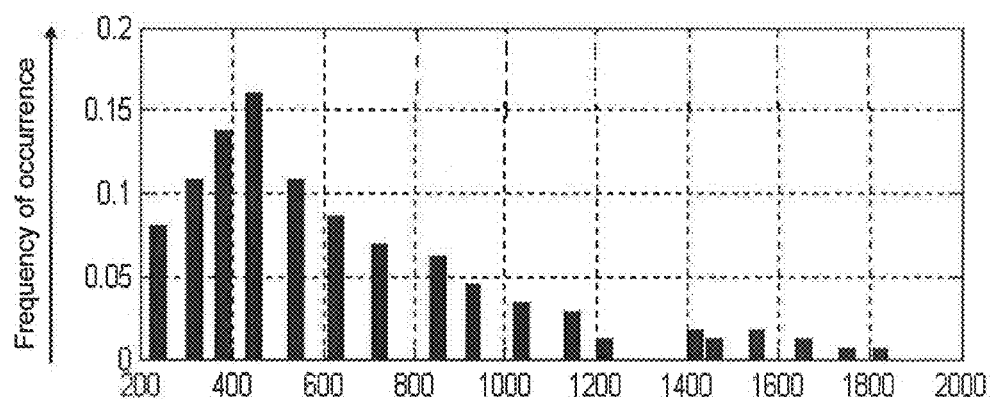
FIG. 7a illustrates a histogram of time-frequency test statistics calculated using a time-frequency weighting function, for a signal of interest, in accordance with an embodiment of the present subject matter.
Figure 7B:
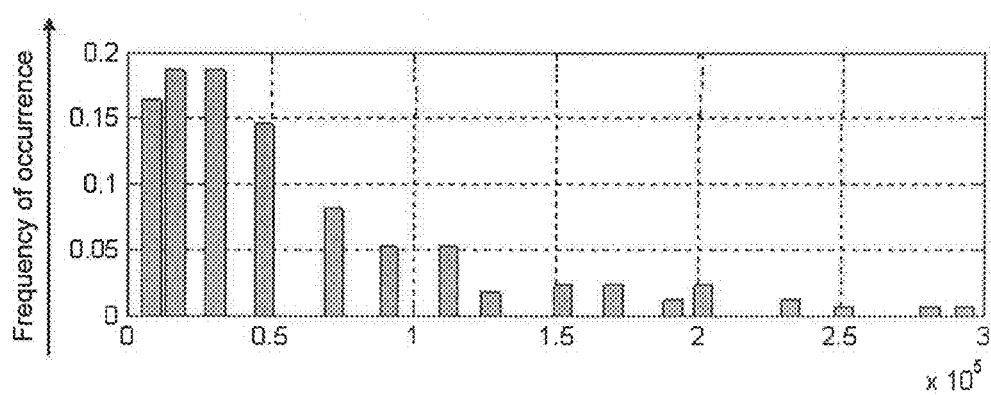
FIG. 7b illustrates a histogram of time-frequency test statistics calculated using a time-frequency weighting function, for noise, in accordance with an embodiment of the present subject matter.
Figure 8:
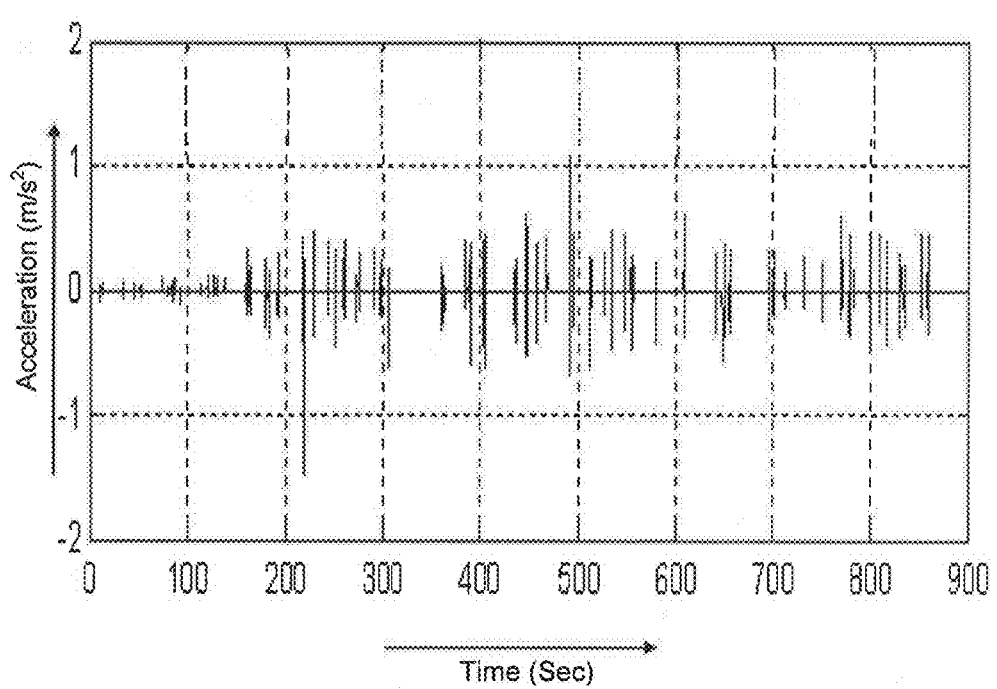
FIG. 8 illustrates a graphical representation of the first set of windows having values of time-frequency test statistics lower than the threshold value of test statistics i.e. second set of windows, in accordance with an embodiment of the present subject matter.

Referring to FIG. 7a, a histogram of time-frequency test statistics calculated using the time-frequency weighting function, for the signal of interest, is illustrated. Further referring to FIG. 7b, a histogram of time-frequency test statistics calculated using the time-frequency weighting function, for the noise, is illustrated. The system 102 may use a threshold value of time-frequency test statistics ($\gamma_T$) for distinguishing between the noise s0 (t) and the signal of interest s0 (t), in the first set of windows. In one embodiment, the system 102 may use 1400 as the threshold value of the time-frequency test statistics. The first set of windows having values of the time-frequency test statistics lower than the threshold value of test statistics is illustrated using FIG. 8 and are identified as the second set of windows. Further, the second set of windows is denoted using xT(t) in further description.

Subsequent to identification of the second set of windows, the system 102 may calculate Eigen values for the WVS of the second set of windows xT(t). In one embodiment, the Eigen values may indicate the time-frequency energy distribution i.e. spectral features of the second set of windows xT(t). The system 102 may calculate the Eigen values by performing Eigen decomposition of a correlation matrix of time-frequency energy distribution (WVS) of the second set of windows xT(t). In one embodiment, the system 102 may determine a correlation matrix, with N*N dimension, using a below mentioned Equation 11.

$$W_C = (\overline{W}_{xT})(\overline{W}_{xT})^H \qquad \text{Equation 11}$$

Figure 9:
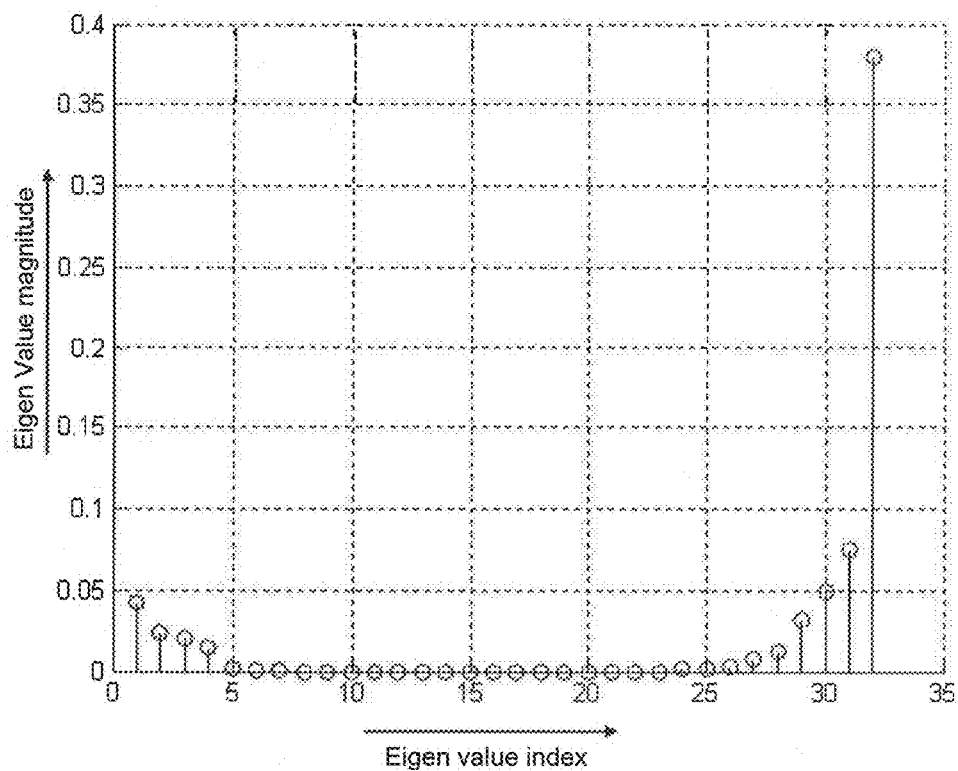
FIG. 9 illustrates a graphical representation of Eigen values of WVS of the second set of windows, in accordance with an embodiment of the present subject matter.

Here, in the Equation 11, $\overline{W}_{xT}$ denotes the WVS of the second set of windows xT(t) and H represents a Hermitian transpose. Referring to FIG. 9, a graphical representation of Eigen values of WVS of the second set of windows is illustrated. X-axis of the FIG. 9 represents Eigen value index and Y-axis represents an Eigen value magnitude.

Following calculation of the Eigen values, the system 102 may identify a third set of windows from the second set of windows based on a predefined Eigen threshold. The system 102 may determine windows, of the second set of windows, having the Eigen values greater than the predefined Eigen threshold and may thus identify the third set of windows. Further, the system 102 may cluster the Eigen values of the third set of windows into clusters of Eigen values. In one embodiment, the system 102 may cluster the Eigen values based upon a nearest neighbor rule. The nearest neighbor rule may use Euclidean distances associated with the Eigen values for clustering.

Figure 10:
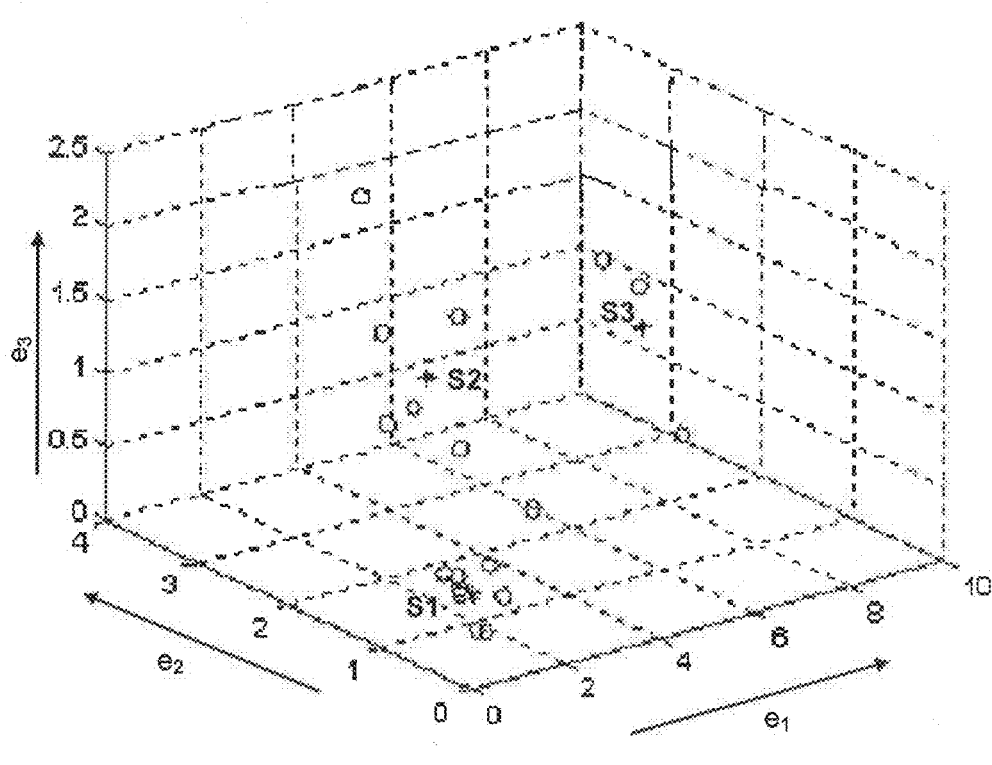
FIG. 10 illustrates a 3-Dimensional scatter plot of the Eigen values of the third set of windows, in accordance with an embodiment of the present subject matter.

Post clustering the Eigen values of the third set of windows, the system 102 may compute centroids of the clusters of Eigen values. In one embodiment, the system 102 may compute the centroids by using a k-means clustering technique. The centroids may indicate relevant categories of events. The relevant categories may also be identified as classes of events and may be used interchangeably in the description henceforth. Referring to FIG. 10, a 3-Dimensional scatter plot of the Eigen values of the third set of windows is illustrated. The FIG. 10 illustrates the Eigen values shown as 'o' and three centroids of the Eigen values shown as *.

Figure 11A:
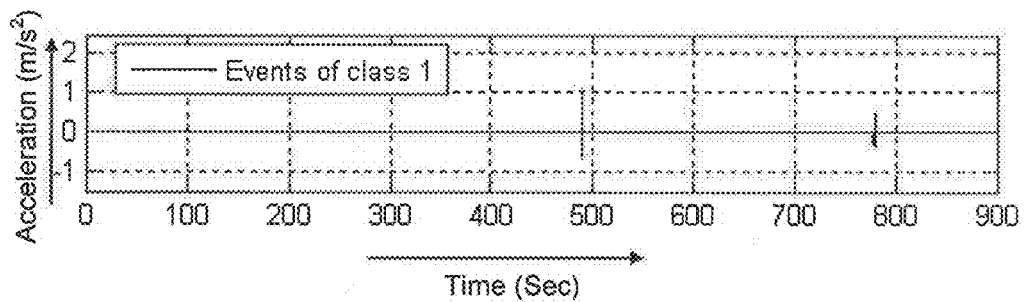
FIGS. 11a, 11b, and 11c collectively illustrate relevant categories of events identified from the raw data, in accordance with an embodiment of the present subject matter.
Figure 11B:
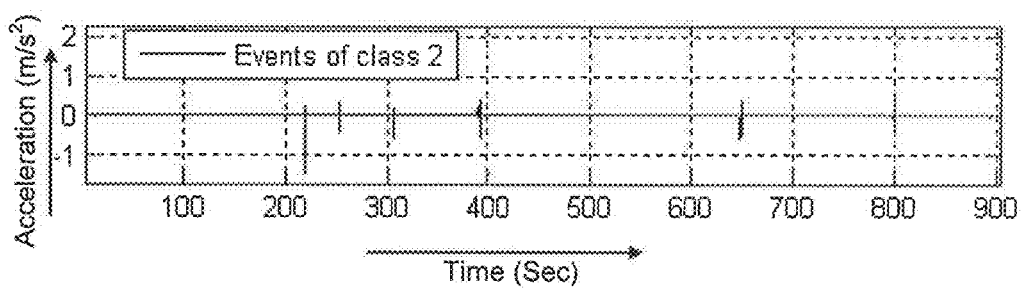
Figure 11C:
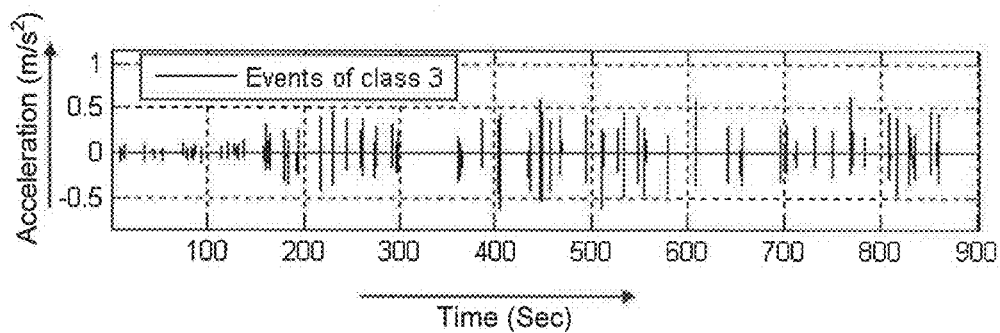

Subsequent to calculation of the centroids, the system 102 may classify at least one window, of the third set of windows, with the Eigen values having a nearest distance to one of the centroids. In one embodiment, the system 102 may classify the third set of windows into one of the three classes of events indicated by the three centroids. Thus, the system 102 may achieve reduction in data size by identifying the relevant categories of events from the raw data, using the above described method. Further, referring to FIGS. 11a, 11b, and 11c relevant categories of events identified from the raw data are illustrated. In one embodiment, the FIG. 11a illustrates events of class 1, FIG. 11b illustrates events of class 2, and FIG. 11c illustrates events of class 3. Further, in each of the FIGS. 11a, 11b, and 11c, x-axis represents time in seconds and y-axis represents acceleration in m/s2.

The raw data used for identifying the relevant categories of events being an acceleration data of a vehicle, the events of class 1, 2, and 3 may be analyzed for determining a driving pattern of a user driving the vehicle. The system 102, while analyzing the classes of the events, may compute a markov model. The system 102 may compute the markov model based on transitions between the relevant categories of events. In one embodiment, the three centroids illustrated by the FIG. 10 may be labeled as S1, S2, and S3. Further, the three centroids may be modeled as three states of the markov model. The system 102 may derive a graphical representation i.e. a graph, of the transitions, by using the markov model.

In one embodiment, the system 102 may compute Laplacian energy by using the graph of the transitions. The Laplacian energy may be represented in form of a Laplacian matrix. The system 102 may compute the Laplacian energy by using a difference between an adjacency matrix of the graph and a degree matrix of the graph. In one embodiment, the system 102 may compute the Laplacian energy (LE) of the graph (G), using a below mentioned Equation 12.

$$LE(G) = \sum_{i=1}^{n} \left| \mu_i - \frac{2m}{n} \right| \qquad \text{Equation 12}$$

Here, in the equation 12, $$\gamma_1 = \mu_i - \frac{2m}{n}$$

denotes auxiliary Eigen values, 'n' denotes number of vertices, 'm' denotes number of edges, $\mu_1, \ldots \mu_n$ denotes Eigen values of the Laplacian matrix.

In one embodiment, the system 102 may compute a score for a driving pattern related to the vehicle. The system 102 may compute the score by using the Laplacian energy. For example, the system 102 may use the Laplacian energy as the score for at least one of the driving pattern related to the vehicle, road surface condition, and a status of machine being monitored.

Figure 12A:
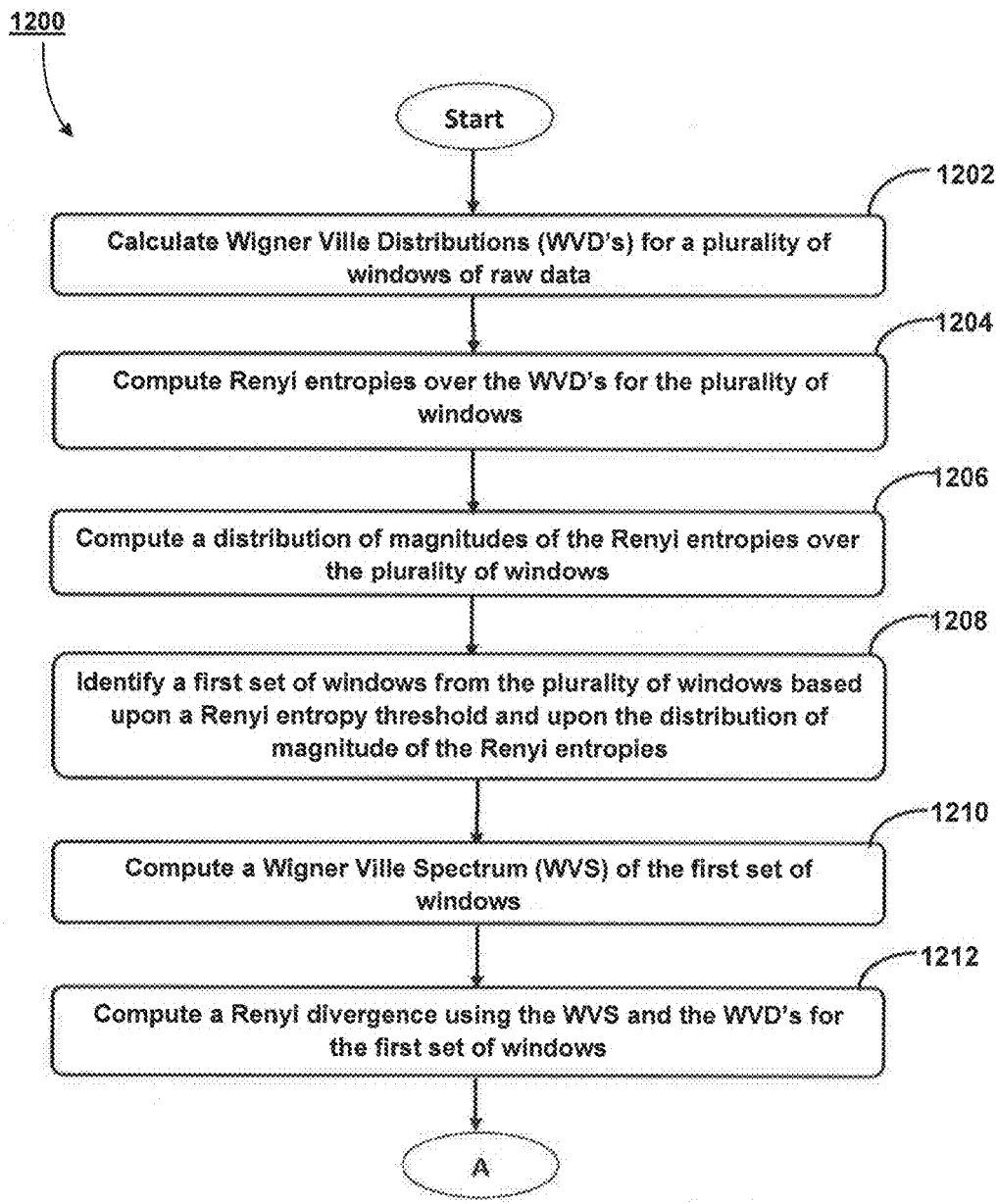
FIGS. 12a and 12b show flowcharts illustrating a method for reducing size of raw data, in accordance with an embodiment of the present subject matter.
Figure 12B:
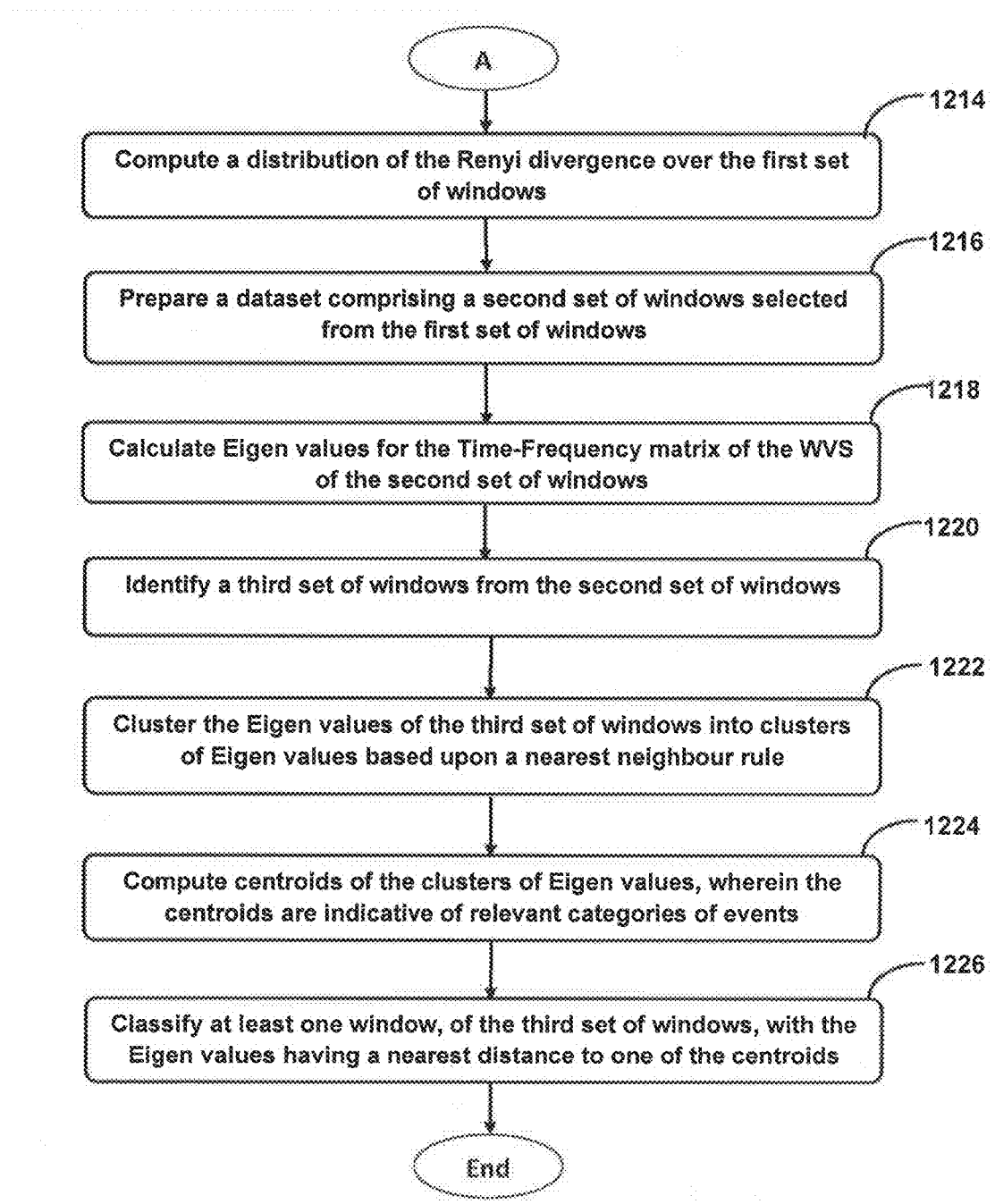

Referring now to FIGS. 12a and 12b, a method 1200 for reducing size of raw data is described, in accordance with an embodiment of the present subject matter. The method 1200 may be described in the general context of computer executable instructions. Generally, computer executable instructions can include routines, programs, objects, components, data structures, procedures, modules, functions, etc., that perform particular functions or implement particular abstract data types. The method 300 may also be practiced in a distributed computing environment where functions are performed by remote processing devices that are linked through a communications network. In a distributed computing environment, computer executable instructions may be located in both local and remote computer storage media, including memory storage devices.

The order in which the method 1200 is described is not intended to be construed as a limitation, and any number of the described method blocks can be combined in any order to implement the method 1200 or alternate methods. Additionally, individual blocks may be deleted from the method 1200 without departing from the spirit and scope of the subject matter described herein. Furthermore, the method can be implemented in any suitable hardware, software, firmware, or combination thereof. However, for ease of explanation, in the embodiments described below, the method 1200 may be considered to be implemented in the above described system 102.

At block 1202, Wigner Ville Distributions (WVD's) for a plurality of windows of raw data may be calculated. A window of the plurality of windows may comprise a predefined number of samples of the raw data. In one implementation, the WVD's may be calculated by the processor 110.

At block 1204, Renyi entropies may be computed over the WVD's for the plurality of windows. In one implementation, the Renyi entropies may be computed by the processor 110.

At block 1206, a distribution of magnitudes of the Renyi entropies may be computed over the plurality of windows. In one implementation, the Renyi entropies may be computed by the processor 110.

At block 1208, a first set of windows may be identified from the plurality of windows based upon a Renyi entropy threshold and upon the distribution of magnitude of the Renyi entropies. In one implementation, the first set of windows may be identified by the processor 110.

At block 1210, a Wigner Ville Spectrum (WVS) of the first set of windows may be computed. The WVS may indicate an average of the WVD's of all windows present in the first set of windows. The WVS may be stored in form of a Time-Frequency matrix. In one implementation, the WVS of the first set of windows may be computed by the processor 110.

At block 1212, a Renyi divergence may be computed using the WVS and the WVD's for the first set of windows. In one implementation, the Renyi divergence may be computed using the WVS and the WVD's for the first set of windows by the processor 110.

At block 1214, a distribution of the Renyi divergence over the first set of windows may be computed. In one implementation, the distribution of the Renyi divergence over the first set of windows may be computed by the processor 110.

At block 1216, a dataset comprising a second set of windows may be prepared by selecting from the first set of windows. The second set of windows may have the Renyi divergence lower than a predefined divergence threshold. In one implementation, the dataset comprising the second set of windows may be prepared by the processor 110.

At block 1218, Eigen values may be calculated for the Time-Frequency matrix of the WVS of the second set of windows. The Eigen values may indicate spectral features of the second set of windows. In one implementation, the Eigen values may be calculated by the processor 110.

At block 1220, a third set of windows may be identified from the second set of windows. The third set of windows may have the Eigen values greater than a predefined Eigen threshold. In one implementation, the third set of windows may be identified by the processor 110.

At block 1222, the Eigen values of the third set of windows may be clustered into clusters of the Eigen values based upon a nearest neighbor rule. In one implementation, the Eigen values of the third set of windows may be clustered by the processor 110.

At block 1224, centroids of the clusters of the Eigen values may be computed. The centroids may indicate relevant categories of events. In one implementation, the centroids of the clusters of the Eigen values may be computed by the processor 110.

At block 1226, at least one window, of the third set of windows, with the Eigen values having a nearest distance to one of the centroids may be classified. In one implementation, the at least one window, of the third set of windows may be classified by the processor 110.

Although implementations for methods and systems for reducing size of raw data have been described in language specific to structural features and/or methods, it is to be understood that the appended claims are not necessarily limited to the specific features or methods described. Rather, the specific features and methods are disclosed as examples of implementations for reducing size of raw data.

Exemplary embodiments discussed above may provide certain advantages. Though not required to practice aspects of the disclosure, these advantages may include those provided by the following features.

Some embodiments may enable a system and a method to identify relevant categories of events from raw data.

Some embodiments may enable a system and a method to achieve reduction in data size based on spectral and statistical properties of the raw data.

Some embodiments may enable a system and a method to save energy required for transmitting the raw data by reducing the data size.

What is claimed is:

1. A method for reducing size of raw data based on spectral and statistical properties of the raw data by performing time-frequency data analysis to identify relevant categories of events from the raw data, the method comprising:

calculating, by a processor, Wigner Ville Distributions (WVD's) for a plurality of windows of the raw data, wherein a window of the plurality of windows comprises a predefined number of samples of the raw data;

computing, by the processor, Renyi entropies over the WVD's for the plurality of windows;

computing, by the processor, a distribution of magnitudes of the Renyi entropies over the plurality of windows;

identifying, by the processor, a first set of windows from the plurality of windows based upon a Renyi entropy threshold and upon the distribution of magnitudes of the Renyi entropies, wherein the Renyi entropy threshold is related to a complexity of the raw data, and wherein the complexity indicates an amount of information present in the raw data;

computing, by the processor, a Wigner Ville Spectrum (WVS) of the first set of windows, wherein the WVS is indicative of an average of the WVD's of all windows present in the first set of windows, and wherein the WVS is stored in form of a Time-Frequency matrix;

computing, by the processor, a Renyi divergence using the WVS and the WVD's for the first set of windows;

computing, by the processor, a distribution of the Renyi divergence over the first set of windows;

preparing, by the processor, a dataset comprising a second set of windows selected from the first set of windows, wherein the second set of windows has the Renyi divergence lower than a predefined divergence threshold, and wherein the predefined divergence threshold is selected based on time-frequency test statistics;

calculating, by the processor, Eigen values for the Time-Frequency matrix of the WVS of the second set of windows, wherein the Eigen values are indicative of spectral features of the second set of windows;

identifying, by the processor, a third set of windows from the second set of windows, wherein the third set of windows has the Eigen values greater than a predefined Eigen threshold;

clustering, by the processor, the Eigen values of the third set of windows into clusters of Eigen values based upon a nearest neighbour rule;

computing, by the processor, centroids of the clusters of Eigen values, wherein the centroids are indicative of the relevant categories of events; and classifying, by the processor, at least one window, of the third set of windows, with the Eigen values having a nearest distance to one of the centroids, thereby reducing size of the raw data.

2. The method of claim 1, wherein the raw data is generated by a sensor.

3. The method of claim 1, wherein the raw data comprises at least one of an acceleration data of a vehicle and an Electrocardiogram (ECG) data.

4. The method of claim 1, wherein the distribution of the Renyi divergence is computed by histogram evaluation.

5. The method of claim 1, further comprising computing a markov model based on transitions between the relevant categories of events.

6. The method of claim 5, further comprising using the markov model for deriving a graphical representation of the transitions.

7. The method of claim 6, further comprising computing Laplacian energy by using the graphical representation of the transitions.

8. The method of claim 7, further comprising computing a score for a driving pattern related to a vehicle, wherein the score is computed based on the Laplacian energy.

9. A system for reducing size of the raw data based on spectral and statistical properties of the raw data by performing time-frequency data analysis to identify relevant categories of events from the raw data, the system comprises:
   a processor;
   a memory coupled to the processor, wherein the processor is capable for executing programmed instructions stored in the memory to:
      calculate Wigner Ville Distributions (WVD's) for a plurality of windows of the raw data, wherein a window of the plurality of windows comprises a predefined number of samples of the raw data;
      compute Renyi entropies over the WVD's for the plurality of windows;
      compute a distribution of magnitudes of the Renyi entropies over the plurality of windows;
      identify a first set of windows from the plurality of windows based upon a Renyi entropy threshold and upon the distribution of magnitudes of the Renyi entropies, wherein the Renyi entropy threshold is related to a complexity of the raw data, and wherein the complexity indicates an amount of information present in the raw data;
      compute Wigner Ville Spectrum (WVS) of the first set of windows, wherein the WVS is indicative of an average of the WVD's of all windows present in the first set of windows, and wherein the WVS is stored in form of a Time-Frequency matrix;
      compute a Renyi divergence using the WVS and the WVD's for the first set of windows;
      compute a distribution of the Renyi divergence over the first set of windows;
      prepare a dataset comprising a second set of windows selected from the first set of windows, wherein the second set of windows has the Renyi divergence lower than a predefined divergence threshold, and wherein the predefined divergence threshold is selected based on time-frequency test statistics;
      calculate Eigen values for the Time-Frequency matrix of the WVS of the second set of windows, wherein the Eigen values are indicative of spectral features of the second set of windows;
      identify a third set of windows from the second set of windows, wherein the third set of windows has the Eigen values greater than a predefined Eigen threshold;
      cluster the Eigen values of the third set of windows into clusters of Eigen values based upon a nearest neighbour rule;
      compute centroids of the clusters of Eigen values, wherein the centroids are indicative of the relevant categories of events; and
      classify at least one window, of the third set of windows, with the Eigen values having a nearest distance to one of the centroids, thereby reducing size of the raw data.

10. The system of claim 9, wherein the raw data is generated by a sensor.

11. The system of claim 9, wherein the raw data comprises at least one of an acceleration data of a vehicle and an Electrocardiogram (ECG) data.

12. The system of claim 9, wherein the distribution of the Renyi divergence is computed by histogram evaluation.

13. The system of claim 9, wherein the system is further configured to compute a markov model based on transitions between the relevant categories of events.

14. The system of claim 13, wherein the system is further configured to derive a graphical representation of the transitions using the markov model.

15. The system of claim 14, wherein the system is further configured to compute Laplacian energy by using the graphical representation of the transitions.

16. The system of claim 15, wherein the system is further configured to compute a score for a driving pattern related to a vehicle, wherein the score is computed based on the Laplacian energy.

17. A non-transitory computer readable medium embodying a program executable in a computing device for reducing size of the raw data based on spectral and statistical properties of the raw data by performing time-frequency data analysis to identify relevant categories of events from the raw data, the program comprising:
   a program code for calculating Wigner Ville Distributions (WVD's) for a plurality of windows of the raw data, wherein a window of the plurality of windows comprises a predefined number of samples of the raw data;
   a program code for computing Renyi entropies over the WVD's for the plurality of windows;
   a program code for computing a distribution of magnitudes of the Renyi entropies over the plurality of windows;
   a program code for identifying a first set of windows from the plurality of windows based upon a Renyi entropy threshold and upon the distribution of magnitudes of the Renyi entropies, wherein the Renyi entropy threshold is related to a complexity of the raw data, and wherein the complexity indicates an amount of information present in the raw data;
   a program code for computing a Wigner Ville Spectrum (WVS) of the first set of windows, wherein the WVS is indicative of an average of the WVD's of all windows present in the first set of windows, and wherein the WVS is stored in form of a Time-Frequency matrix;
   a program code for computing a Renyi divergence using the WVS and the WVD's for the first set of windows;
   a program code for computing a distribution of the Renyi divergence over the first set of windows;
   a program code for preparing a dataset comprising a second set of windows selected from the first set of windows, wherein the second set of windows has the Renyi divergence lower than a predefined divergence threshold, and wherein the predefined divergence threshold is selected based on time-frequency test statistics;
   a program code for calculating Eigen values for the Time-Frequency matrix of the WVS of the second set of windows, wherein the Eigen values are indicative of spectral features of the second set of windows;

a program code for identifying a third set of windows from the second set of windows, wherein the third set of windows has the Eigen values greater than a predefined Eigen threshold;

a program code for clustering the Eigen values of the third set of windows into clusters of Eigen values based upon a nearest neighbour rule;

a program code for computing centroids of the clusters of Eigen values, wherein the centroids are indicative of the relevant categories of events; and a program code for classifying at least one window, of the third set of windows, with the Eigen values having a nearest distance to one of the centroids, thereby reducing size of the raw data.

* * * * *